United States Patent
Lee et al.

(10) Patent No.: US 9,577,583 B2
(45) Date of Patent: Feb. 21, 2017

(54) POWER AMPLIFIER

(71) Applicant: SAMSUNG ELECTRO-MECHANICS CO., LTD., Suwon-Si, Gyeonggi-Do (KR)

(72) Inventors: Kwang Du Lee, Suwon-Si (KR); Jeong Hoon Kim, Suwon-Si (KR); Ho Kwon Yoon, Suwon-Si (KR); Joong Jin Nam, Suwon-Si (KR); Kyu Jin Choi, Suwon-Si (KR); Suk Chan Kang, Suwon-Si (KR); Jae Hyouck Choi, Suwon-Si (KR); Kyung Hee Hong, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 64 days.

(21) Appl. No.: 14/273,265

(22) Filed: May 8, 2014

(65) Prior Publication Data

US 2015/0145606 A1   May 28, 2015

(30) Foreign Application Priority Data

Nov. 26, 2013 (KR) .................. 10-2013-0144299

(51) Int. Cl.
   *H03G 3/20* (2006.01)
   *H03F 1/02* (2006.01)
   (Continued)

(52) U.S. Cl.
   CPC ............ *H03F 1/0266* (2013.01); *H03F 3/193* (2013.01); *H03F 3/211* (2013.01);
   (Continued)

(58) Field of Classification Search
   CPC ...... H03F 1/0266; H03F 1/226; H03F 1/3205; H03F 1/3241; H03F 1/56; H03F 3/195; H03F 3/245; H03F 1/223; H03F 2200/102; H03F 2200/18; H03F 2200/192; H03F 2200/222; H03F 2200/387; H03F 2200/451; H03F 2200/453; H03F 2200/456; H04B 2001/0441
   (Continued)

(56) References Cited

U.S. PATENT DOCUMENTS 4,873,493 A * 10/1989 Fujiwara ............... H03F 1/0244
                                                          330/134
6,445,247 B1 * 9/2002 Walker .................. H03F 1/0222
                                                          330/10

(Continued)

FOREIGN PATENT DOCUMENTS

KR   10-2006-0112539 A   11/2006
KR   10-2011-0095423 A   8/2011

*Primary Examiner* — Steven J Mottola
*Assistant Examiner* — Hafizur Rahman
(74) *Attorney, Agent, or Firm* — NSIP Law

(57) ABSTRACT

A power amplifier may include a first amplifying unit receiving a first bias signal to amplify a power level of an input signal; an envelope detecting unit detecting an envelope of the input signal; a comparing circuit unit comparing a peak value of the detected envelope with a preset reference voltage; and a second amplifying unit amplifying the power level of the input signal according to a second bias signal set depending on a comparison result of the comparing circuit unit.

19 Claims, 8 Drawing Sheets

(51) Int. Cl.
*H03F 3/193* (2006.01)
*H03F 3/21* (2006.01)

(52) U.S. Cl.
CPC .... *H03F 2200/102* (2013.01); *H03F 2200/18* (2013.01); *H03F 2200/451* (2013.01); *H03F 2203/21131* (2013.01)

(58) Field of Classification Search
USPC ....... 330/136, 149, 253, 261, 277, 295, 296, 330/311; 375/296, 297; 455/114.3
See application file for complete search history.

(56) References Cited

U.S. PATENT DOCUMENTS

| | | | | |
|---|---|---|---|---|
| 6,972,628 | B2* | 12/2005 | Eo | H03F 1/0266 330/133 |
| 7,408,412 | B2* | 8/2008 | Yamamoto | H03F 1/302 330/285 |
| 7,492,223 | B2* | 2/2009 | Behzad | H03F 1/3211 330/136 |
| 8,289,084 | B2* | 10/2012 | Morimoto | H03F 1/0216 330/296 |
| 2004/0100323 | A1* | 5/2004 | Khanifar | H03F 1/0244 330/51 |
| 2006/0244524 | A1 | 11/2006 | Park et al. | |
| 2009/0206934 | A1* | 8/2009 | Goh | H03F 1/0261 330/296 |
| 2011/0285460 | A1 | 11/2011 | Murao | |

* cited by examiner

POWER AMPLIFIER

CROSS-REFERENCE TO RELATED APPLICATION

This application claims the benefit of Korean Patent Application No. 10-2013-0144299 filed on Nov. 26, 2013, with the Korean Intellectual Property Office, the disclosure of which is incorporated herein by reference.

BACKGROUND

The present disclosure relates to a power amplifier.

In general, a power amplifier is a circuit which serves to amplify a low power radio frequency (RF) signal received from a transmitting terminal in a preset frequency into a high power RF signal using a nonlinear active element.

Meanwhile, in accordance with the development of communications technology, in order to prevent interference between a required high data rate and a multi-pass, digital modulation technologies have been developed.

Among these, many communications systems such as WLAN, and the like use orthogonal frequency division multiplexing (OFDM), a modulation scheme using hundreds of carriers (sub-carriers) having orthogonality to increase frequency availability. However, since frequency components are overlapped in the OFDM scheme, the amplitude of a signal may have a difference from an average magnitude of ten times at most, depending on a phase of the signal. Therefore, data loss may be prevented in a case in which the power amplifier is designed so that such a signal may also be linearly amplified.

That is, the power amplifier is designed to have an output based on maximum amplitude so that an input signal having the maximum amplitude can also be linearly amplified without being distorted. In this case, when considering that a signal section having high amplitude is significantly small as compared with signal sections having an average magnitude, a large amount of power loss may occur.

The following related art document (Patent Document 1) relates to the disclosure of operating an amplifier by turning switches connected to the respective power nodes on, depending on a signal level of an envelope using a plurality of driving amplifying stages. However, since the disclosure in the Patent Document 1 requires the plurality of amplifiers to have a plurality of loads and switches, a volume of a circuit may be increased and defects such as a voltage drop and signal distortion may be caused by resistance of the switch inserted into a power supplying unit.

RELATED ART DOCUMENT (Patent Document 1) Korean Patent Laid-Open Publication No. 10-2006-0112539

SUMMARY

An aspect of the present disclosure may provide a power amplifier having improved efficiency by dividing an amplifying unit into a plurality of amplifying units and detecting a peak value of an envelope to thereby operate respective switching elements in response to a preset level of power.

According to an aspect of the present disclosure, a power amplifier may include: a first amplifying unit receiving a first bias signal to amplify a power level of an input signal; an envelope detecting unit detecting an envelope of the input signal; a comparing circuit unit comparing a peak value of the detected envelope with a preset reference voltage; and a second amplifying unit amplifying the power level of the input signal according to a second bias signal set depending on a comparison result of the comparing circuit unit.

The first amplifying unit may include a first transistor amplifying the power level of the input signal; a first bias unit providing the first bias signal to a control terminal of the first transistor; and a first capacitor blocking a direct current component of the input signal.

The second amplifying unit may include a second transistor amplifying the power level of the input signal; a second bias unit providing the second bias signal to a control terminal of the second transistor; and a second capacitor blocking a direct current component of the input signal.

The power amplifier may further include an input impedance matching unit matching levels of impedance between a signal input terminal to which the input signal is supplied and the first and second amplifying units; and an output impedance matching unit matching levels of impedance between the first and second amplifying units and a signal output terminal from which the signal having the amplified power level is output.

The power amplifier may further include a first inductor connected between the first and second amplifying units and a power input terminal and decreasing an alternating current component of a driving voltage provided by the power input terminal.

The power amplifier may further include a third amplifying unit receiving a third bias signal set depending on the comparison result of the comparing circuit unit to amplify the power level of the input signal.

The third amplifying unit may include a third transistor amplifying the power level of the input signal; a third bias unit providing the third bias signal to a control terminal of the third transistor; and a third capacitor blocking a direct current component of the input signal.

According to another aspect of the present disclosure, a power amplifier may include: a first transistor having a first terminal connected to a power input terminal and a second terminal connected to a ground terminal and amplifying a power level of an input signal provided to a control terminal thereof; a first bias unit providing a preset first bias signal to the control terminal of the first transistor; an envelope comparing circuit unit detecting an envelope of the input signal and comparing a peak value of the envelope with a preset reference voltage; a second transistor having a first terminal connected to the first terminal of the first transistor and a second terminal connected to a ground terminal and amplifying the power level of the input signal provided to a control terminal thereof; and a second bias unit providing a second bias signal to the control terminal of the second transistor when the peak value of the envelope is higher than the reference voltage.

The envelope comparing circuit unit may include an envelope detecting unit detecting the envelope of the input signal; and a comparing circuit unit comparing the peak value of the detected envelope with the preset reference voltage.

The power amplifier may further include a first capacitor connected to a signal transfer path between the input signal and the first transistor and blocking a direct current component of the input signal; and a second capacitor connected to a signal transfer path between the input signal and the second transistor and blocking a direct current component of the input signal.

The power amplifier may further include a first inductor connected between the first and second transistors and the power input terminal and decreasing an alternating current component of a driving voltage provided by the power input terminal.

The power amplifier may further include a third transistor having a first terminal connected to the power input terminal and a second terminal connected to a ground terminal and amplifying the power level of the input signal provided to a control terminal thereof; and a third bias unit providing a third bias signal to the control terminal of the third transistor when the peak value of the envelope is higher than the reference voltage.

The power amplifier may further include a third capacitor connected to a signal transfer path between the input signal and the third transistor and blocking a direct current component of the input signal.

The power amplifier may further include an input impedance matching unit including a fourth capacitor connected between a signal input terminal to which the input signal is supplied and the first and second transistors and a second inductor connected between the fourth capacitor and a ground terminal; and an output impedance matching unit including a third inductor connected between the first and second transistors and a signal output terminal from which the signal having the amplified power level is output and a fifth capacitor connected between the third inductor and a ground terminal.

According to another aspect of the present disclosure, a power amplifier may include a first amplifying unit receiving a first bias signal to amplify a power level of an input signal; an envelope detecting unit detecting an envelope of an output signal of the first amplifying unit; a comparing circuit unit comparing a peak value of the detected envelope with a preset reference voltage; and a second amplifying unit amplifying the power level of the input signal according to a second bias signal set depending on a comparison result of the comparing circuit unit.

The first amplifying unit may include a first transistor amplifying the power level of the input signal; a first bias unit providing the first bias signal to a control terminal of the first transistor; and a first capacitor blocking a direct current component of the input signal.

The second amplifying unit may include a second transistor amplifying the power level of the input signal; a second bias unit providing the second bias signal to a control terminal of the second transistor; and a second capacitor blocking a direct current component of the input signal.

The power amplifier may further include an input impedance matching unit matching levels of impedance between a signal input terminal to which the input signal is supplied and the first and second amplifying units; and an output impedance matching unit matching levels of impedance between the first and second amplifying units and a signal output terminal from which the signal having the amplified power level is output.

The power amplifier may further include a first inductor connected between the first and second amplifying units and a power input terminal and decreasing an alternating current component of a driving voltage provided by the power input terminal.

The power amplifier may further include a third amplifying unit receiving a third bias signal set depending on the comparison result of the comparing circuit unit to amplify the power level of the input signal.

The third amplifying unit may include a third transistor amplifying the power level of the input signal; a third bias unit providing the third bias signal to a control terminal of the third transistor; and a third capacitor blocking a direct current component of the input signal.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
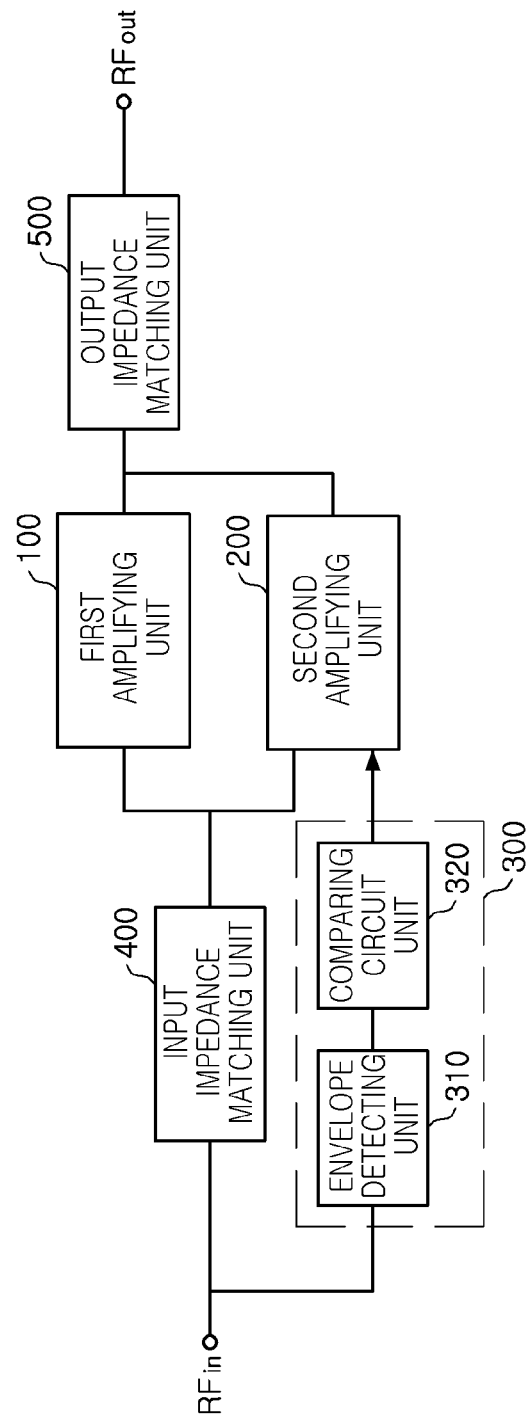
FIG. 1 is a block diagram illustrating a power amplifier according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Throughout the drawings, the same or like reference numerals will be used to designate the same or like elements.

FIG. 1 is a block diagram illustrating a power amplifier according to an exemplary embodiment of the present disclosure.

Referring to FIG. 1, a power amplifier according to an exemplary embodiment of the present disclosure may include a first amplifying unit 100, a second amplifying unit 200, an envelope detecting unit 310, and a comparing circuit unit 320. In addition, the power amplifier according to an exemplary embodiment of the present disclosure may further include an input impedance matching unit 400 and an output impedance matching unit 500.

The power amplifier may amplify power of an input signal $RF_{in}$, more particularly, an input high frequency signal and may output an output high frequency signal $RF_{out}$ having a high power level.

Figure 2:
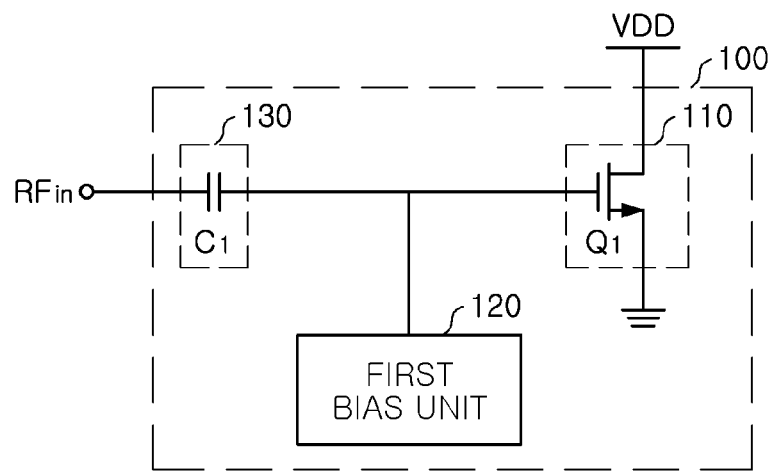
FIG. 2 is a circuit diagram illustrating a first amplifying unit in a configuration of the power amplifier shown in FIG. 1.

FIG. 2 is a circuit diagram illustrating a first amplifying unit 100 in a configuration of the power amplifier shown in FIG. 1.

Referring to FIG. 2, the first amplifying unit 100 may receive a first bias signal and may amplify a power level of the input signal $RF_{in}$. In this case, the first amplifying unit 100 may include a first transistor ($Q_1$) 110 amplifying the power level of the input signal $RF_{in}$, a first bias unit 120 providing the first bias signal to a control terminal of the first transistor 110, and a first capacitor ($C_1$) 130 blocking a direct current component of the input signal $RF_{in}$.

The first amplifying unit 100 shown in FIG. 2, an amplifying unit having the simplest form, may have a structure including the first transistor 110 having a gate receiving the input signal $RF_{in}$ and the first bias signal, a drain receiving a preset driving voltage VDD and outputting an output signal $RF_{out}$, and a source connected to a ground terminal. In this case, an example of the first transistor 110 may be a metal-oxide semiconductor field effect transistor (MOSFET).

The first bias signal may be provided to the gate of the first transistor 110. In this case, the first bias signal may be in response to the input signal $RF_{in}$ and have a fixed gate voltage such that the first transistor 110 may be continually operated.

Figure 3:
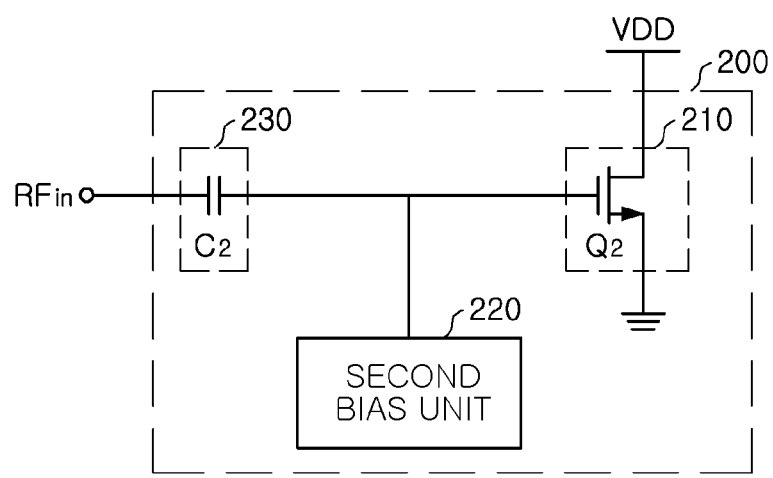
FIG. 3 is a circuit diagram illustrating a second amplifying unit in the configuration of the power amplifier shown in FIG. 1.

FIG. 3 is a circuit diagram illustrating a second amplifying unit 200 in the configuration of the power amplifier shown in FIG. 1.

Referring to FIG. 3, the second amplifying unit 200 may receive a second bias signal and may amplify the power level of the input signal $RF_{in}$. In this case, the second amplifying unit 200 may include a second transistor ($Q_2$) 210 amplifying the power level of the input signal $RF_{in}$, a second bias unit 220 providing the second bias signal to a control terminal of the second transistor 210, and a second capacitor (C2) 230 blocking the direct current component of the input signal $RF_{in}$.

The second amplifying unit 200 shown in FIG. 3, an amplifying unit having the simplest form, may have a structure including the second transistor 210 having a gate receiving the input signal $RF_{in}$ and the second bias signal, a drain receiving the preset driving voltage VDD and outputting the output signal $RF_{out}$ and a source connected to a ground terminal. In this case, an example of the second transistor 210 may be a metal-oxide semiconductor field effect transistor (MOSFET).

Meanwhile, the second bias signal may be provided to the gate of the first transistor 210. In this case, the second bias signal may be set according to a comparison result obtained by the comparing circuit unit 320 comparing a peak value of an envelope detected by the envelope detecting unit 310 with a preset reference voltage $V_{ref}$. Meanwhile, operations and configurations of the envelope detecting unit 310 and the comparing circuit unit 320 will be described below with the reference to FIG. 4.

That is, in the power amplifier according to an exemplary embodiment of the present disclosure, the first bias signal having a fixed voltage level may be applied to the gate of the first transistor 110 so that the first transistor 110 may be continually operated, and conversely, the second bias signal may be applied to the gate of the second transistor 210 in a case in which the peak value of the detected envelope of the input signal $RF_{in}$ is higher than the preset reference voltage $V_{ref}$.

In other words, in the power amplifier according to an exemplary embodiment of the present disclosure, the first and second amplifying units 100 and 200 may include the first and second transistors 110 and 210, respectively. The first bias signal having a fixed voltage level may be applied to the first transistor 110 such that the first transistor 110 may be continually operated in a low power state. The second transistor 210 may be operated in a high power state and controlled by the envelope detecting unit 310 and the comparing circuit unit 320.

Figure 4:
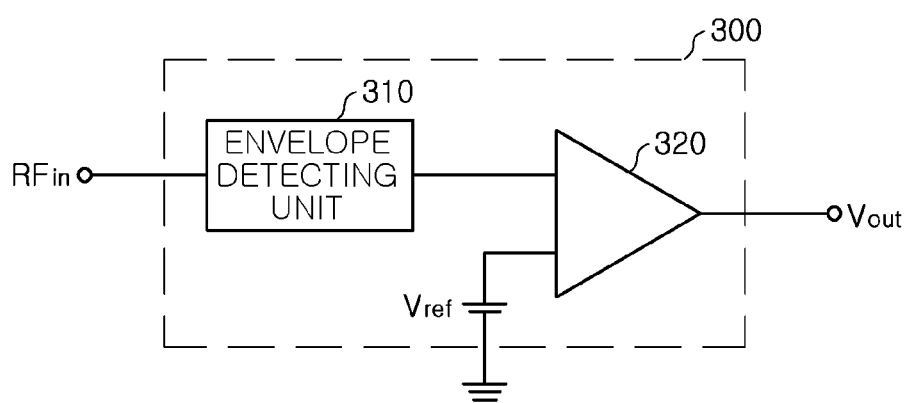
FIG. 4 is a circuit diagram illustrating an envelope detecting unit and a comparing circuit unit in the configuration of the power amplifier shown in FIG. 1.

FIG. 4 is a circuit diagram illustrating the envelope detecting unit 310 and the comparing circuit unit 320 in the configuration of the power amplifier shown in FIG. 1.

The envelope detecting unit 310 may detect an envelope of the input signal $RF_{in}$.

The comparing circuit unit 320 may compare the peak value of the envelope detected by the envelope detecting unit 310 with the preset reference voltage $V_{ref}$, and may be formed of a comparator 320 having a hysteresis function, as an example. In this case, the reference voltage $V_{ref}$ may be set to be turned on when an envelope signal of the input signal $RF_{in}$ reaches a desired voltage level or more.

Figure 5:
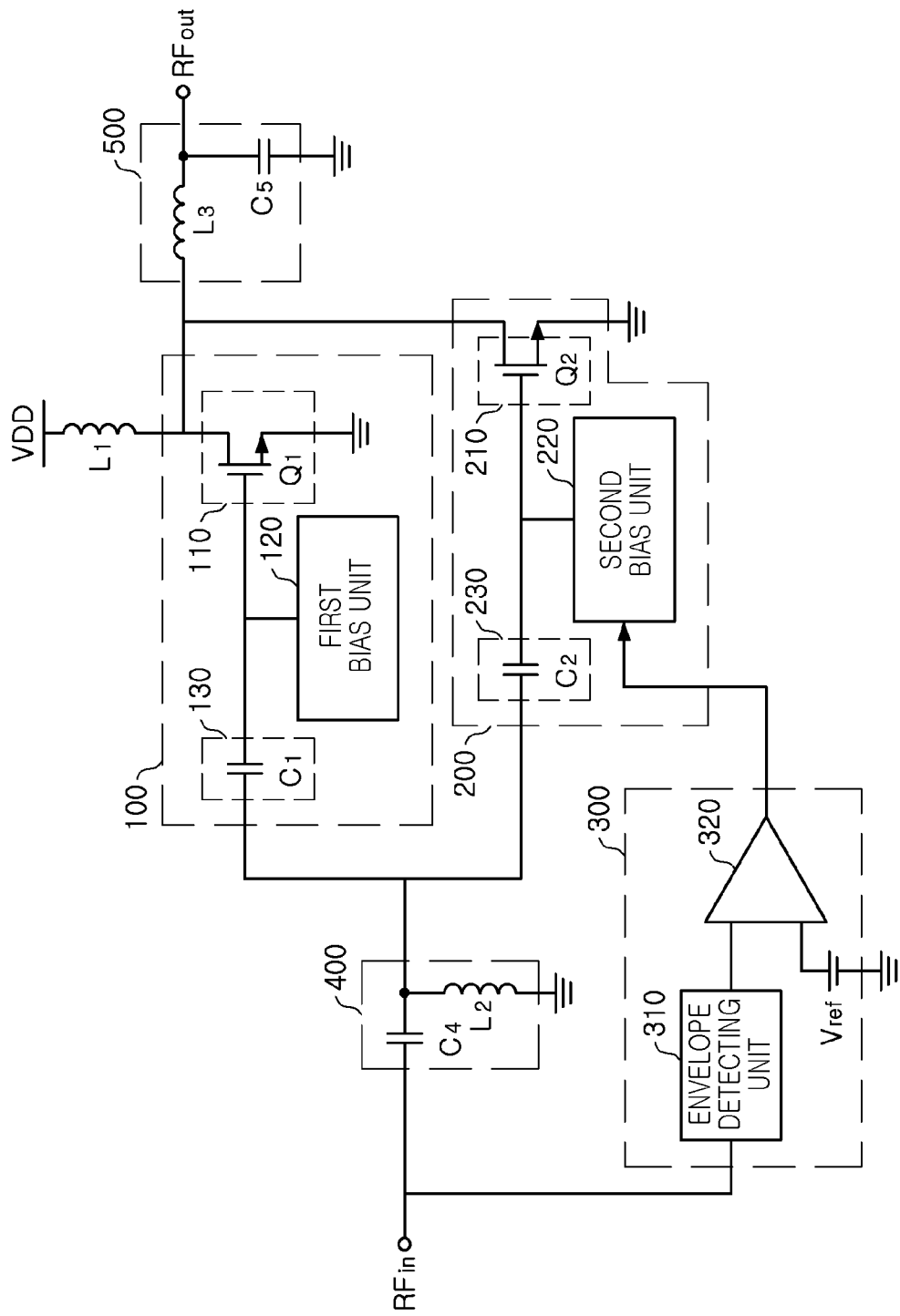
FIG. 5 is a detailed circuit diagram of the power amplifier shown in FIG. 1.

FIG. 5 is a detailed circuit diagram of the power amplifier shown in FIG. 1.

Referring to FIGS. 1 and 5, the power amplifier according to an exemplary embodiment of the present disclosure may further include an input impedance matching unit 400 matching levels of impedance between a signal input terminal to which the input signal $RF_{in}$ is supplied and the first and second amplifying units 100 and 200 and an output impedance matching unit 500 matching levels of impedance between the first and second amplifying units 100 and 200 and a signal output terminal from which the signal having the amplified power level is output.

More specifically, the input impedance matching unit 400 may include a fourth capacitor $C_4$ formed between the signal input terminal to which the input signal $RF_{in}$ is supplied and the first and second amplifying units 100 and 200 and blocking the direct current component of the input signal $RF_{in}$. In addition, the input impedance matching unit 400 may further include a second inductor $L_2$ formed between the fourth capacitor $C_4$ and a ground terminal and matching levels of impedance between the signal input terminal to which the input signal $RF_{in}$ is supplied and the first and second amplifying units 100 and 200.

In addition, the output impedance matching unit 500 may include a third inductor L3 formed between the first and second amplifying units 100 and 200 and the signal output terminal from which the signal having the amplified power level is output. In addition, the output impedance matching unit 500 may further include a fifth capacitor C5 formed between the third inductor L3 and a ground terminal to form a preset level of impedance with the third inductor L3 and matching levels of impedance between the signal output terminal from which the signal having the amplified power level is output and the first and second amplifying units 100 and 200.

In addition, the power amplifier according to an exemplary embodiment of the present disclosure may further include a first inductor L1 connected between the first and second amplifying units 100 and 200 and a power input terminal to which the driving voltage VDD is provided. The first inductor L1 may decrease an alternating current component of the driving voltage VDD provided by the power input terminal.

Figure 6:
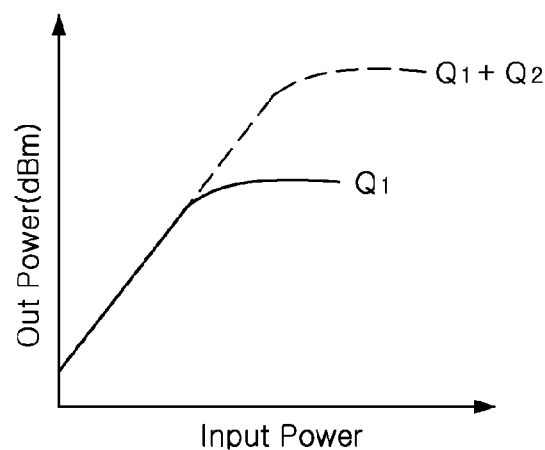
FIG. 6 is a graph illustrating power operating levels of the first and second amplifying units in the configuration of the power amplifier shown in FIG. 1.

FIG. 6 is a graph illustrating power operating levels of the first and second amplifying units 100 and 200 in the configuration of the power amplifier shown in FIG. 1.

Figure 7:
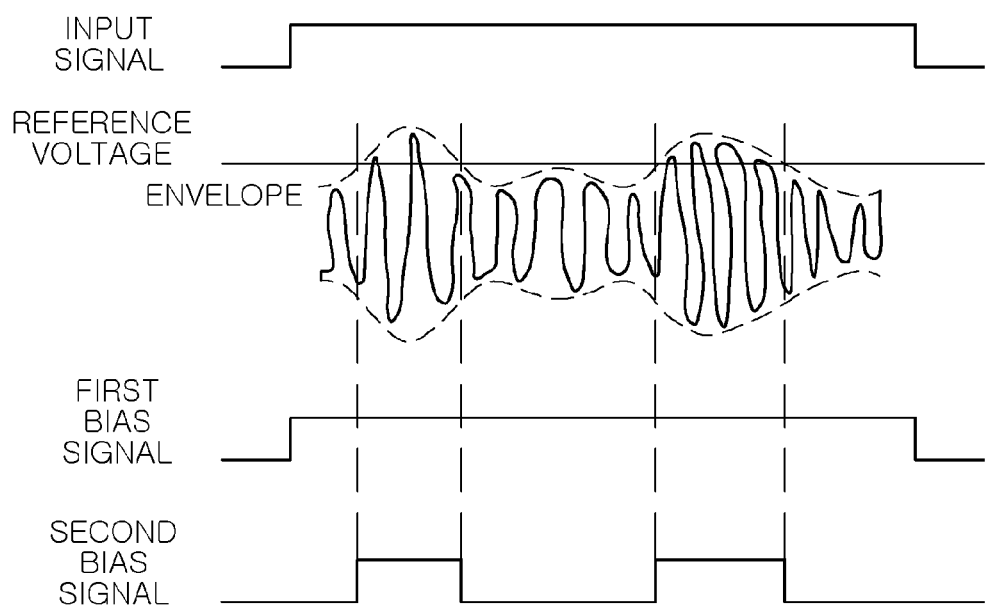
FIG. 7 is a diagram illustrating an operation of the power amplifier according to the exemplary embodiment of the present disclosure.

FIG. 7 is a diagram illustrating an operation of the power amplifier according to the exemplary embodiment of the present disclosure.

Referring to FIGS. 6 and 7, in the case that the input signal $RF_{in}$ is provided, the first bias signal having the fixed gate voltage such that the first transistor 110 may be continually operated may be provided to the control terminal of the first transistor 110.

Meanwhile, the envelope detecting unit 310 may detect the envelope of the input signal $RF_{in}$ and provide information regarding the detected envelope to the comparing circuit unit 320. The comparing circuit unit 320 may compare the peak value of the detected envelope with the preset reference voltage $V_{ref}$ and output the second bias signal when the peak value of the detected envelope is higher than the preset reference voltage $V_{ref}$ to thereby provide the second bias signal to the gate of the second transistor 210.

That is, referring to FIG. 6, the second transistor 210 may be controlled by the second bias signal applied thereto according to the comparison result of the comparing circuit unit 320, whereby the input signal $RF_{in}$ may be amplified without being distorted.

Figure 8:
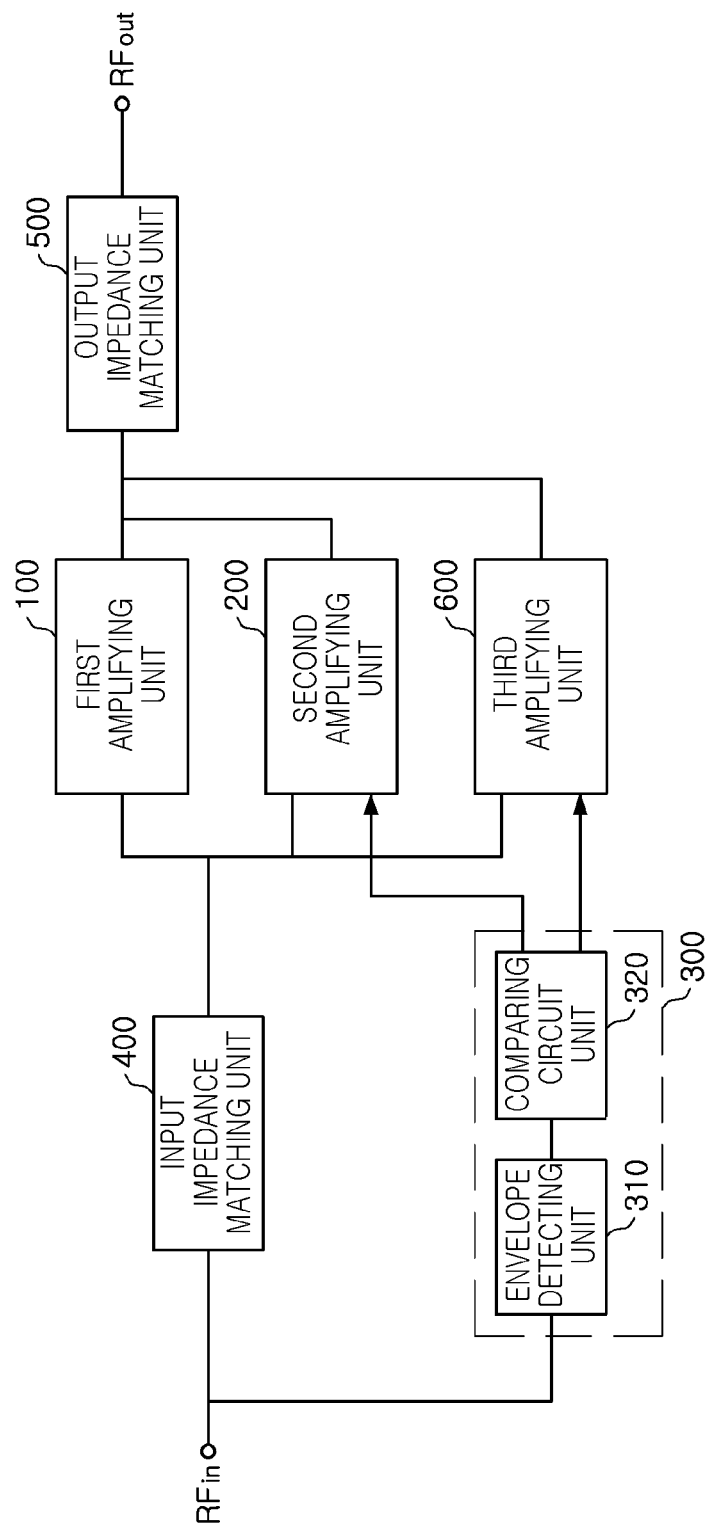
FIG. 8 is a block diagram illustrating another example of the power amplifier shown in FIG. 1.

FIG. 8 is a block diagram illustrating another example of the power amplifier shown in FIG. 1.

A power amplifier according to another exemplary embodiment of the present disclosure may further include a third amplifying unit 600 receiving a third bias signal set according the comparison result of the comparing circuit unit 320 to amplify the power level of the input signal $RF_{in}$.

The third amplifying unit 600 may include a third transistor amplifying the power level of the input signal $RF_{in}$, a third bias unit providing the third bias signal to a control terminal of the third transistor, and a third capacitor blocking the direct current component of the input signal $RF_{in}$. In this case, in the case that the peak value of the envelope detected by the envelope detecting unit 310 is higher than a preset first reference voltage $V_{ref1}$ and is lower than a preset second reference voltage $V_{ref2}$, the second bias signal may be provided to the control terminal of the second transistor 210. In the case that the peak value of the envelope is higher than the preset second reference voltage $V_{ref2}$, the third bias signal may be provided to the control terminal of the third transistor.

That is, in the power amplifier according to another exemplary embodiment of the present disclosure shown in FIG. 8, the first bias signal having the fixed voltage level may be applied to the gate of the first transistor 110 operated in a low power state, so that the first transistor 110 may be continually operated. The second bias signal may be applied to the gate of the second transistor 210 operated in an intermediate power state, so that the second transistor may be operated in a case in which the peak value of the envelope of the input signal $RF_{in}$ is higher than the preset first reference voltage $V_{ref1}$ and is lower than the preset second reference voltage $V_{ref2}$. Further, the third bias signal may be applied to the gate of the third transistor operated in a high power state, so that the third transistor may be operated in a case in which the peak value of the envelope of the input signal $RF_{in}$ is lower than the preset second reference voltage $V_{ref2}$. Thereby, the input signal $RF_{in}$ may be amplified by the first and third amplifying units without being distorted.

Figure 9:
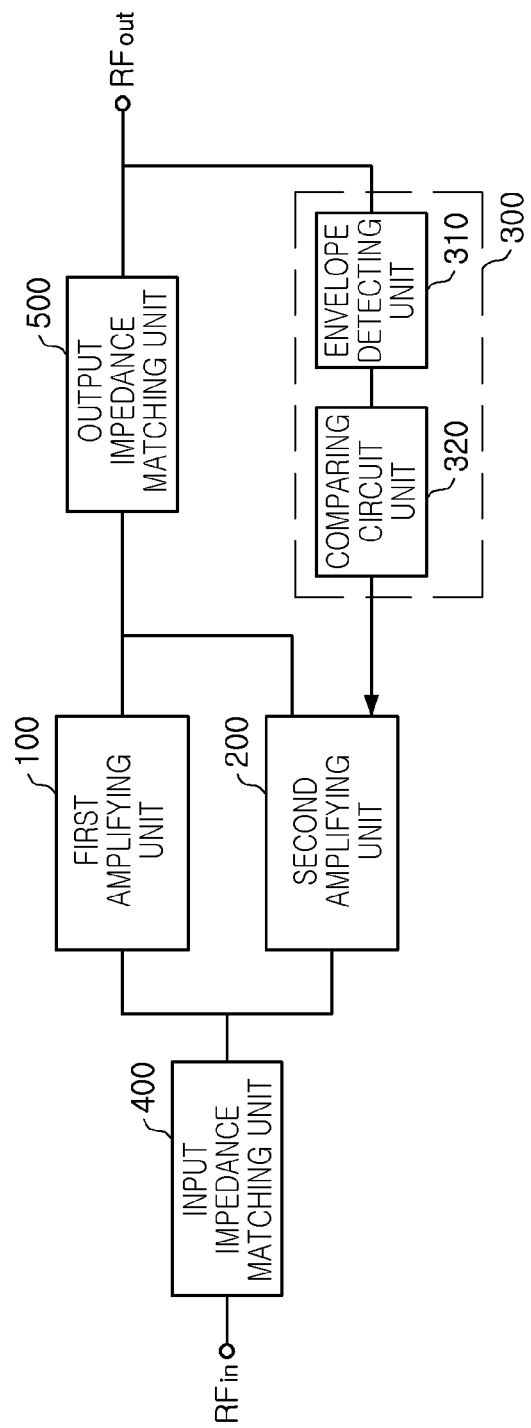
FIG. 9 is a block diagram illustrating a power amplifier according to another exemplary embodiment of the present disclosure.

FIG. 9 is a block diagram illustrating a power amplifier according to another exemplary embodiment of the present disclosure.

Referring to FIG. 9, a power amplifier according to another exemplary embodiment of the present disclosure may include the first amplifying unit 100, the second amplifying unit 200, the envelope detecting unit 310, and the comparing circuit unit 320. Descriptions of configurations of the power amplifier according to another exemplary embodiment of present disclosure shown in FIG. 9, overlapped with those of the power amplifier shown in FIG. 1, will be omitted.

That is, unlike in the case of the power amplifier shown in FIG. 1, the envelope detecting unit 310 and the comparing circuit unit 320 of the power amplifier according to another exemplary embodiment of the present disclosure may be disposed on a path between the first and second amplifying units 100 and 200 and the signal output terminal. That is, the envelope detecting unit 310 may detect an envelope of an output signal of the first amplifying unit 100 and provide information regarding the detected envelope to the comparing circuit unit 320. The comparing circuit unit 320 may compare the peak value of the provided envelope with the preset reference voltage $V_{ref}$ and output the second bias signal set according the comparison result of the comparing circuit unit 320, to thereby provide the second bias signal to the second amplifying unit 200.

Figure 10:
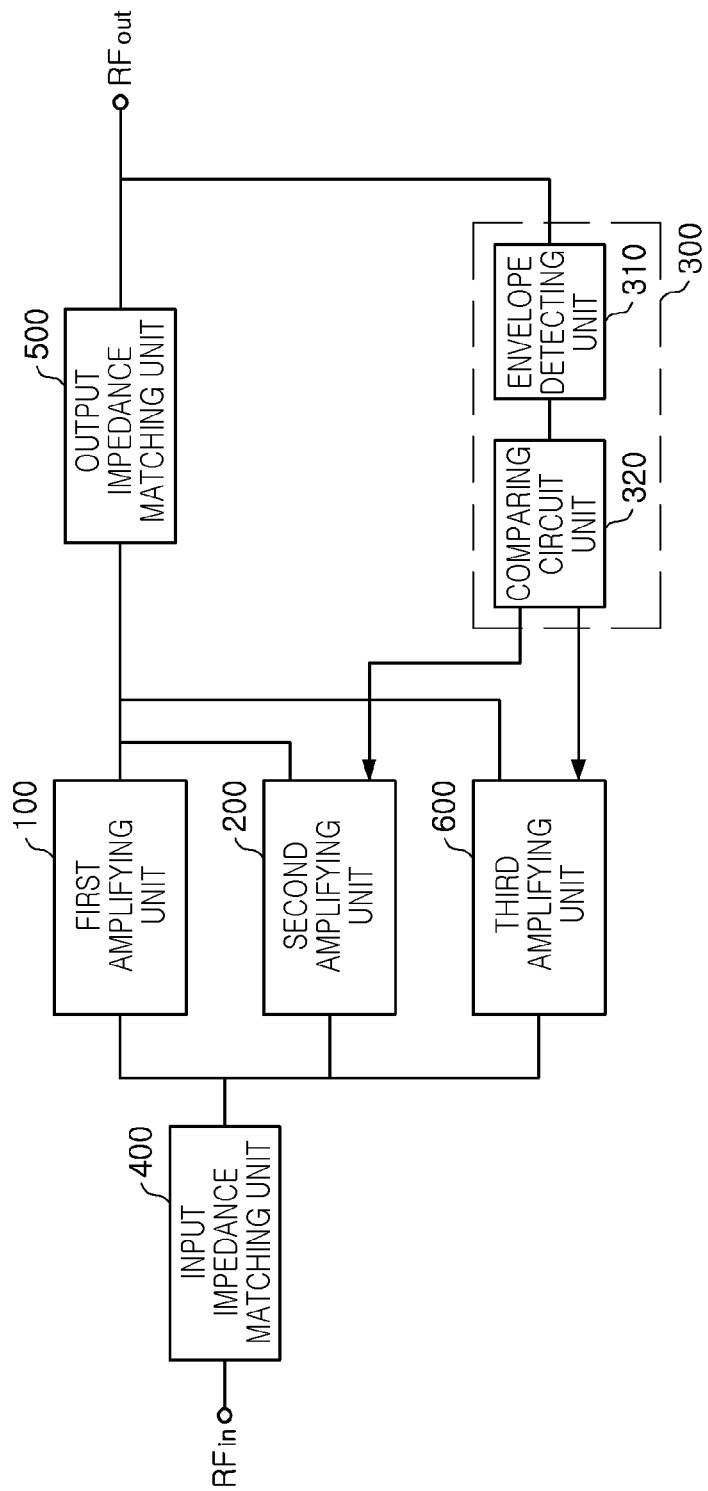
FIG. 10 is a block diagram illustrating another example of the power amplifier shown in FIG. 9.

FIG. 10 is a block diagram illustrating another example of the power amplifier shown in FIG. 9.

A power amplifier according to another exemplary embodiment of the present disclosure shown in FIG. 10 may further include a third amplifying unit receiving a third bias signal set according the comparison result of the comparing circuit unit 320 to amplify the power level of the input signal $RF_{in}$. The third amplifying unit may include a third transistor amplifying the power level of the input signal, a third bias unit providing the third bias signal to a control terminal of the third transistor, and a third capacitor blocking the direct current component of the input signal $RF_{in}$. Descriptions thereof are the same as those described above, and thus, will be omitted.

That is, in order to amplify the input signal $RF_{in}$ without being distorted, the power amplifier according to an exemplary embodiment of the present disclosure may detect the envelope of the input signal $RF_{in}$, compare the detected envelope with the preset reference voltage, and then control the second amplifying unit 200 or the third amplifying unit according to the bias signal set depending on the comparison result.

Alternatively, the power amplifier according to another exemplary embodiment of the present disclosure may detect the envelope of the signal output from the first and second amplifying units 100 and 200, compare the detected envelope with the preset reference voltage, and then set the bias signal to thereby provide the set bias signal to the second amplifying unit 200 or the third amplifying unit 300.

As set forth above, according to exemplary embodiment of the present disclosure, the power amplifier may have improved efficiency by dividing an amplifying unit into a plurality of amplifying units and detecting a peak value of an envelope to thereby operate respective switching elements in response to a preset level of power and may amplify an input signal without being distorted.

While exemplary embodiments have been shown and described above, it will be apparent to those skilled in the art that modifications and variations could be made without departing from the spirit and scope of the present disclosure as defined by the appended claims.

What is claimed is:
1. A power amplifier comprising:
a first amplifying unit receiving a first bias signal to amplify a power level of an input signal;
an envelope detecting unit detecting an envelope of the input signal;
a comparing circuit unit comparing a peak value of the detected envelope with a preset reference voltage;

a second amplifying unit amplifying the power level of the input signal according to a second bias signal set depending on a comparison result of the comparing circuit unit; and a first inductor connected between the first and second amplifying units and a power input terminal and decreasing an alternating current component of a driving voltage provided by the power input terminal.

2. A power amplifier comprising:

a first amplifying unit receiving a first bias signal to amplify a power level of an input signal, wherein the first amplifying unit includes:
   a first transistor amplifying the power level of the input signal,
   a first bias unit providing the first bias signal to a control terminal of the first transistor, and
   a first capacitor blocking a direct current component of the input signal;

an envelope detecting unit detecting an envelope of the input signal;

a comparing circuit unit comparing a peak value of the detected envelope with a preset reference voltage; and a second amplifying unit amplifying the power level of the input signal according to a second bias signal set depending on a comparison result of the comparing circuit unit.

3. A power amplifier comprising:

a first amplifying unit receiving a first bias signal to amplify a power level of an input signal;

an envelope detecting unit detecting an envelope of the input signal;

a comparing circuit unit comparing a peak value of the detected envelope with a preset reference voltage; and a second amplifying unit amplifying the power level of the input signal according to a second bias signal set depending on a comparison result of the comparing circuit unit, wherein the second amplifying unit includes:
   a second transistor amplifying the power level of the input signal,
   a second bias unit providing the second bias signal to a control terminal of the second transistor, and
   a second capacitor blocking a direct current component of the input signal.

4. A power amplifier comprising:

a first amplifying unit receiving a first bias signal to amplify a power level of an input signal;

an envelope detecting unit detecting an envelope of the input signal;

a comparing circuit unit comparing a peak value of the detected envelope with a preset reference voltage;

a second amplifying unit amplifying the power level of the input signal according to a second bias signal set depending on a comparison result of the comparing circuit unit;

an input impedance matching unit matching levels of impedance between a signal input terminal to which the input signal is supplied and the first and second amplifying units; and an output impedance matching unit matching levels of impedance between the first and second amplifying units and a signal output terminal from which a signal having the amplified power level is output.

5. A power amplifier comprising:

a first amplifying unit receiving a first bias signal to amplify a power level of an input signal;

an envelope detecting unit detecting an envelope of the input signal;

a comparing circuit unit comparing a peak value of the detected envelope with a preset reference voltage;

a second amplifying unit amplifying the power level of the input signal according to a second bias signal set depending on a comparison result of the comparing circuit unit; and a third amplifying unit receiving a third bias signal set depending on the comparison result of the comparing circuit unit to amplify the power level of the input signal.

6. The power amplifier of claim 5, wherein the third amplifying unit includes:
   a third transistor amplifying the power level of the input signal;
   a third bias unit providing the third bias signal to a control terminal of the third transistor; and
   a third capacitor blocking a direct current component of the input signal.

7. A power amplifier comprising:

a first transistor having a first terminal connected to a power input terminal and a second terminal connected to a ground terminal and amplifying a power level of an input signal provided to a control terminal thereof;

a first bias unit providing a preset first bias signal to the control terminal of the first transistor;

an envelope comparing circuit unit detecting an envelope of the input signal and comparing a peak value of the envelope with a preset reference voltage;

a second transistor having a first terminal connected to the first terminal of the first transistor and a second terminal connected to the ground terminal and amplifying the power level of the input signal provided to a control terminal thereof; and a second bias unit providing a second bias signal to the control terminal of the second transistor when the peak value of the envelope is higher than the reference voltage.

8. The power amplifier of claim 7, wherein the envelope comparing circuit unit includes:
   an envelope detecting unit detecting the envelope of the input signal; and
   a comparing circuit unit comparing the peak value of the detected envelope with the preset reference voltage.

9. The power amplifier of claim 7, further comprising:
   a first capacitor connected to a signal transfer path between the input signal and the first transistor and blocking a direct current component of the input signal; and
   a second capacitor connected to a signal transfer path between the input signal and the second transistor and blocking the direct current component of the input signal.

10. The power amplifier of claim 7, further comprising: a first inductor connected between the first and second transistors and the power input terminal and decreasing an alternating current component of a driving voltage provided by the power input terminal.

11. The power amplifier of claim 7, further comprising:
   a third transistor having a first terminal connected to the power input terminal and a second terminal connected to the ground terminal and amplifying the power level of the input signal provided to a control terminal thereof; and a third bias unit providing a third bias signal to the control terminal of the third transistor when the peak value of the envelope is higher than the reference voltage.

12. The power amplifier of claim 11, further comprising: a third capacitor connected to a signal transfer path between the input signal and the third transistor and blocking a direct current component of the input signal.

13. The power amplifier of claim 7, further comprising:
an input impedance matching unit including a fourth capacitor connected between a signal input terminal to which the input signal is supplied and the first and second transistors and a second inductor connected between the fourth capacitor and the ground terminal; and
an output impedance matching unit including a third inductor connected between the first and second transistors and a signal output terminal from which a signal having the amplified power level is output and a fifth capacitor connected between the third inductor and the ground terminal.

14. A power amplifier, comprising:
a first amplifying unit receiving a first bias signal to amplify a power level of an input signal;
an envelope detecting unit detecting an envelope of an output signal of the first amplifying unit;
a comparing circuit unit comparing a peak value of the detected envelope with a preset reference voltage;
a second amplifying unit amplifying the power level of the input signal according to a second bias signal set depending on a comparison result of the comparing circuit unit; and
a first inductor connected between the first and second amplifying units and a power input terminal and decreasing an alternating current component of a driving voltage provided by the power input terminal.

15. The power amplifier of claim 14, wherein the first amplifying unit includes:
a first transistor amplifying the power level of the input signal;
a first bias unit providing the first bias signal to a control terminal of the first transistor; and
a first capacitor blocking a direct current component of the input signal.

16. The power amplifier of claim 14, wherein the second amplifying unit includes:
a second transistor amplifying the power level of the input signal;
a second bias unit providing the second bias signal to a control terminal of the second transistor; and
a second capacitor blocking a direct current component of the input signal.

17. The power amplifier of claim 14, further comprising:
an input impedance matching unit matching levels of impedance between a signal input terminal to which the input signal is supplied and the first and second amplifying units; and
an output impedance matching unit matching levels of impedance between the first and second amplifying units and a signal output terminal from which a signal having the amplified power level is output.

18. The power amplifier of claim 14, further comprising: a third amplifying unit receiving a third bias signal set depending on the comparison result of the comparing circuit unit to amplify the power level of the input signal.

19. The power amplifier of claim 18, wherein the third amplifying unit includes:
a third transistor amplifying the power level of the input signal;
a third bias unit providing the third bias signal to a control terminal of the third transistor; and
a third capacitor blocking a direct current component of the input signal.

* * * * *